(12) United States Patent
Tung (10) Patent No.: US 9,780,165 B2
(45) Date of Patent: Oct. 3, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 9 days.

(21) Appl. No.: 15/011,683

(22) Filed: Feb. 1, 2016

(65) Prior Publication Data

US 2017/0194422 A1 Jul. 6, 2017

(30) Foreign Application Priority Data

Jan. 6, 2016 (TW) .............................. 105100231 A (51) Int. Cl.
*H01L 29/66* (2006.01)
*H01L 29/78* (2006.01)
*H01L 29/06* (2006.01)
*H01L 21/8234* (2006.01)
*H01L 21/762* (2006.01)
*H01L 21/311* (2006.01)
*H01L 21/306* (2006.01)
*H01L 21/02* (2006.01)
*H01L 27/088* (2006.01)

(52) U.S. Cl.
CPC .... *H01L 29/0649* (2013.01); *H01L 21/02532* (2013.01); *H01L 21/30604* (2013.01); *H01L 21/31111* (2013.01); *H01L 21/76224* (2013.01); *H01L 21/823431* (2013.01); *H01L 21/823481* (2013.01); *H01L 27/0886* (2013.01)

(58) Field of Classification Search
CPC ............. H01L 29/66795; H01L 29/785; H01L 21/823431; H01L 27/0886; H01L 29/66545
USPC ............ 438/283; 257/401, 288, 192; 50/283
See application file for complete search history.

(56) References Cited

U.S. PATENT DOCUMENTS

| 8,440,517 B2 | 5/2013 | Lin et al. | |
| 2013/0187228 A1* | 7/2013 | Xie | ........................ H01L 29/785 257/347 |
| 2014/0042500 A1 | 2/2014 | Wann et al. | |
| 2014/0217517 A1* | 8/2014 | Cai | ....................... H01L 27/0886 257/401 |
| 2015/0123146 A1* | 5/2015 | Krishnan | ............ H01L 21/0243 257/77 |

(Continued)

OTHER PUBLICATIONS

Hsu et al., Title of Invention: Finfet and Method of Fabricating the Same, U.S. Appl. No. 14/818,322, filed Aug. 5, 2015.

(Continued)

*Primary Examiner* — Jonathan Han
(74) *Attorney, Agent, or Firm* — Winston Hsu (57) ABSTRACT

A method for fabricating semiconductor device is disclosed. The method includes the steps of: providing a substrate having a plurality of fin-shaped structures thereon; forming a first shallow trench isolation (STI) between the fin-shaped structures and a second STI around the fin-shaped structures; removing part of the fin-shaped structures; and removing part of the first STI so that the top surfaces of the fin-shaped structures are higher than the top surface of the first STI and lower than the top surface of the second STI.

16 Claims, 7 Drawing Sheets

(56) References Cited

U.S. PATENT DOCUMENTS

| | | | |
|---|---|---|---|
| 2015/0200252 A1* | 7/2015 | Ching | H01L 29/0649 257/510 |
| 2015/0270398 A1 | 9/2015 | Jacob et al. | |
| 2015/0279840 A1* | 10/2015 | Huang | H01L 29/66545 257/384 |
| 2015/0295089 A1* | 10/2015 | Huang | H01L 29/7853 257/401 |
| 2016/0064483 A1* | 3/2016 | Kelly | H01L 29/0847 257/401 |
| 2016/0155670 A1* | 6/2016 | Liaw | H01L 21/823431 257/401 |

OTHER PUBLICATIONS

Hsu et al., Title of Invention: Semiconductor Structure Having Epitaxial Layers, U.S. Appl. No. 14/876,844, filed Oct. 7, 2015.

\* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of creating a height difference between fin-shaped structures and shallow trench isolation (STI).

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Nevertheless, conventional FinFET fabrication of forming recesses after removing part of fin-shaped structures to accommodate the growth of epitaxial layer typically causes the fin-shaped structures to be lower than the surrounding shallow trench isolation (STI) as a result of over-etching, thereby influencing the formation of epitaxial layer afterwards. Hence, how to improve the current FinFET fabrication process for resolving this issue has become an important task in this field.

SUMMARY OF THE INVENTION

According to a preferred embodiment of the present invention, a method for fabricating semiconductor device is disclosed. The method includes the steps of: providing a substrate having a plurality of fin-shaped structures thereon; forming a first shallow trench isolation (STI) between the fin-shaped structures and a second STI around the fin-shaped structures; removing part of the fin-shaped structures; and removing part of the first STI so that the top surfaces of the fin-shaped structures are higher than the top surface of the first STI and lower than the top surface of the second STI.

According to an embodiment of the present invention, a semiconductor device is disclosed. The semiconductor device includes: a substrate; a plurality of fin-shaped structures on the substrate; and a first shallow trench isolation (STI) between the fin-shaped structures and a second STI around the fin-shaped structures. Preferably, the top surfaces of the fin-shaped structures are higher than the top surface of the first STI and lower than the top surface of the second STI.

According to another aspect of the present invention, a semiconductor device is disclosed. The semiconductor device includes: a substrate; a plurality of fin-shaped structures on the substrate; a STI around the fin-shaped structures, wherein the top surfaces of the fin-shaped structure are lower than the top surface of the STI; and an epitaxial layer on the top surfaces and sidewalls of the fin-shaped structures and contacting the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
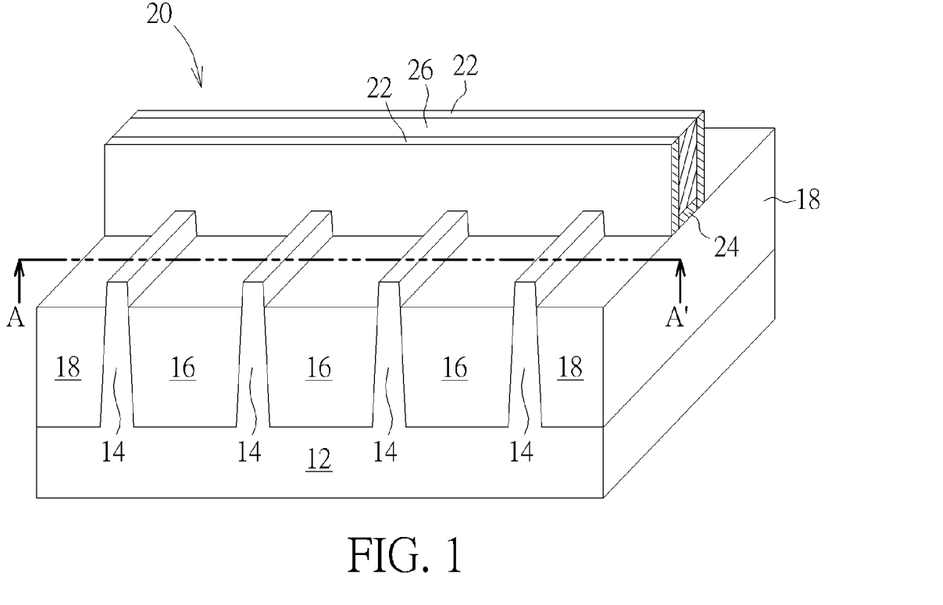
FIGS. 1-5 illustrate a method for fabricating semiconductor device according to a preferred embodiment of the present invention.
Figure 2:
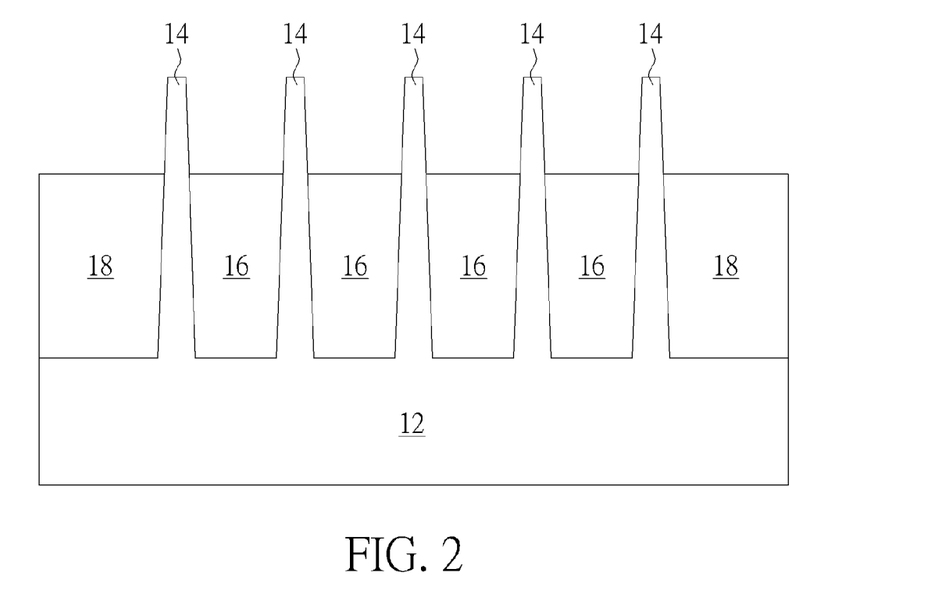

Referring to FIGS. 1-5, FIGS. 1-5 illustrate a method for fabricating semiconductor device according to a preferred embodiment of the present invention, in which FIG. 1 illustrates a 3-dimensional structural view for fabricating a semiconductor device and FIG. 2 illustrates a cross-sectional view of FIG. 1 along sectional line AA'. As shown in FIGS. 1-2, a substrate 12, such as a silicon substrate or silicon-on-insulator (SOI) substrate is first provided, and at least a fin-shaped structure 14 is formed on the substrate 12. Next, a first shallow trench isolation (16) is formed between the fin-shaped structures 14 and a second STI 18 is formed around the fin-shaped structures.

The fin-shaped structures 14 of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 of this embodiment could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structure 14 are all within the scope of the present invention.

The formation of the first STI 16 and second STI 18 could be accomplished by depositing an insulating material composed of silicon oxide on the substrate 12 to cover the fin-shaped structures 14, and a planarizing process, such as chemical mechanical polishing (CMP) process is conducted along with photo-etching process to remove part of the insulating material for forming the first STI 16 between fin-shaped structures 14 and second STI 18 around fin-shaped structures 14. Since the first STI 16 and second STI 18 are fabricating by the same process, the top surfaces of the first STI 16 and second STI 18 at this stage are preferably coplanar and also lower than the top surface of the fin-shaped structures 14, and the bottom surface of the first STI 16 is even with the bottom surface of the second STI 18. Also, even though five fin-shaped structures 14 are disclosed in this embodiment, the quantity of the fin-shaped structures 14 could all be adjusted according to the demand of the product.

Next, a gate structure 20 is formed on the substrate 12 and crossing the fin-shaped structures 14, lightly doped drains (LDDs) (not shown) are formed in the fin-shaped structures 14 adjacent to two sides of the gate structure 20, a spacer 22 is formed adjacent to the sidewalls of the gate structure 20, and source/drain regions (not shown) are formed in the fin-shaped structure 14 adjacent to two sides of the spacer 22.

In this embodiment, the formation of the gate structure 20 is accomplished by sequentially forming a gate dielectric layer 24 and a gate material layer 26 on the substrate 12, performing a pattern transfer by using a patterned resist (not shown) as mask to remove part of the gate material layer 26 and part of gate dielectric layer 24, and stripping to the patterned resist to form a gate structure 20 composed of a patterned gate material layer 26 and patterned gate dielectric layer 24. The spacer 22 could be a single spacer or a composite spacer, which could be selected from the group consisting of $SiO_2$, SiN, SiON, and SiCN. The LDDs and source/drain regions could include n-type or p-type dopants depending on the type of device being fabricated. For instance, if a NMOS FinFET device were to be fabricated, the LDDs and source/drain regions preferably include n-type dopants, whereas if a PMOS FinFET device were to be fabricated, the LDDs and source/drain regions preferably include p-type dopants.

Figure 3:
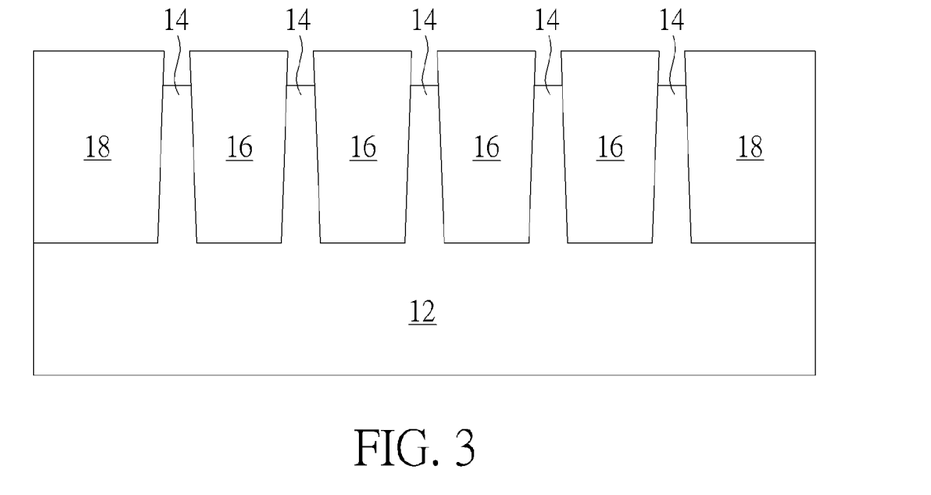

Next, as shown in FIG. 3, an etching process is conducted to remove part of the fin-shaped structures 14 not covered by the gate structure 20. For instance, fin-shaped structures 14 adjacent to two sides of the gate structure 20 are partially removed so that the top surface of all of the fin-shaped structures 14 is slightly lower than the top surfaces of the first STI 16 and second STI 18.

Figure 4:
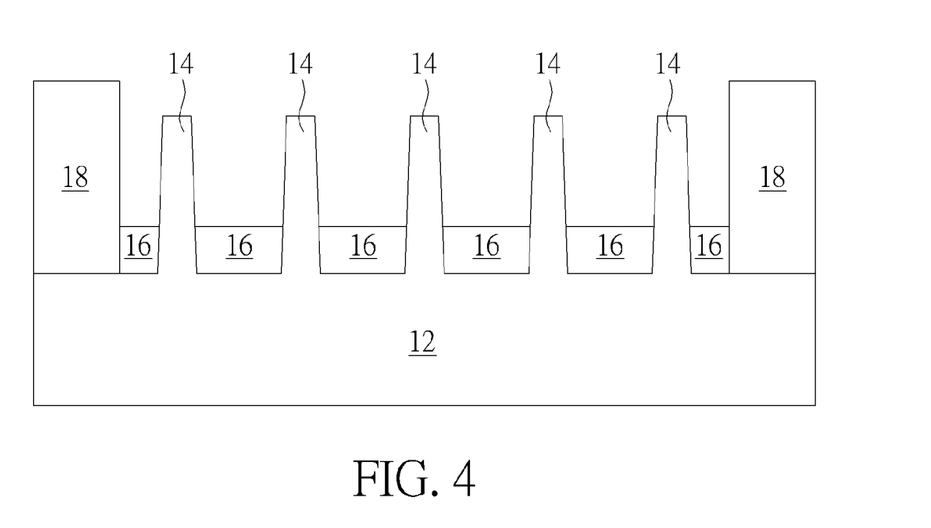

Next, as shown in FIG. 4, a patterned mask (not shown) such as a patterned resist is formed on part of the fin-shaped structures 14 and the region outside the first STI 16, and an etching process is conducted by using the patterned resist as mask to remove part of the first STI 16 so that the top surface of the fin-shaped structures 14 is higher than the top surface of the remaining first STI 16 and lower than the top surface of the second STI 18. In other words, a height difference is created between the first STI 16 and the second STI 18, or more specifically, the first STI 16, fin-shape structures 14, and second STI 18 all share different heights. It should be noted that if only part of the first STI 16 shown in FIG. 2 is removed, the sidewall of the fin-shaped structure 14 at the end would be aligned to or contact the second STI 18. Nevertheless, the present embodiment preferably adjusts the position of the patterned mask used in the aforementioned etching process so that part of the second STI 18 is removed along with part of the first STI 16 so that part of the second STI 18 becomes the first STI 16 with slightly lower height. By doing so, the sidewalls of the fin-shaped structures 14 would not contact the second STI 18 directly. These two variations are all within the scope of the present invention.

In addition to the embodiments disclosed in FIGS. 3-4, an embodiment of the present invention could be accomplished by first providing the structure shown in FIG. 2, forming a patterned mask to cover the fin-shaped structures 14 and the region outside the first STI 16, and then using the patterned mask to remove part of the fin-shaped structures 14 and the first STI 16 sequentially for forming the structure shown in FIG. 4.

In this embodiment, the top surface of the second STI 18 is preferably higher than the top surface of the fin-shaped structures 14 and the top surface of the first STI 16 while the top surface of the fin-shaped structures 14 is also higher than the top surface of the first STI 16. Nevertheless, according to other embodiments of the present invention, the height of these three elements could also be adjusted according to the demand of the product. For instance, it would be desirable to have the top surface of the fin-shaped structures 14 to be higher than the top surfaces of the first STI 16 and second STI 18 while the top surface of the second STI 18 is higher than the top surface of first STI 16, or have the top surface of fin-shaped structures 14 to be even with the top surface of second STI 18 while the top surfaces of both the fin-shaped structures 14 and second STI 18 are higher than the top surface of the first STI 16, which are all within the scope of the present invention.

Figure 5:
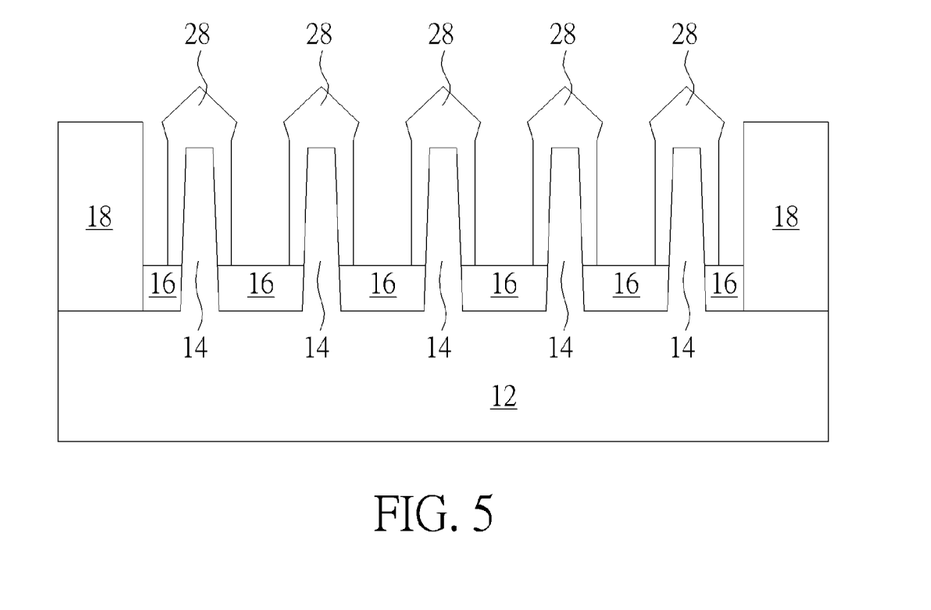

Next, as shown in FIG. 5, an epitaxial growth process is conducted to form an epitaxial layer 28 on the fin-shaped structures 14, in which the epitaxial layer 28 preferably includes silicon germanium (SiGe), but not limited thereto. Specifically, the epitaxial layer 28 is conformally grown on the top surface and sidewalls of fin-shaped structures 14 and part of the top surface of the first STI 16 without filling the space between the fin-shaped structures 14. However, it would also be desirable to extend the epitaxial layer 28 to cover part of the top surface and sidewalls of the second STI 18, which is also within the scope of the present invention.

Figure 6:
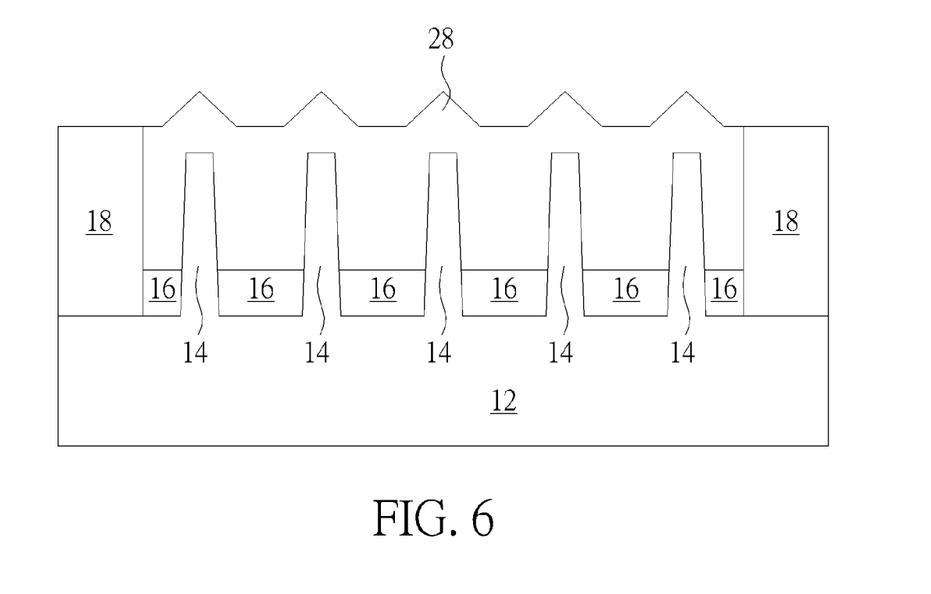
FIG. 6 illustrates a structural view of a semiconductor device according to an embodiment of the present invention.

In addition to the embodiment shown in FIG. 5, according to an embodiment of the present invention, as shown in FIG. 6, it would also be desirable to adjust the covering area of the epitaxial layer 28, such as by having the epitaxial layer 28 to fill all of the spaces between fin-shaped structures 14 and above the first STI 16, which is also within the scope of the present invention.

Figure 7:
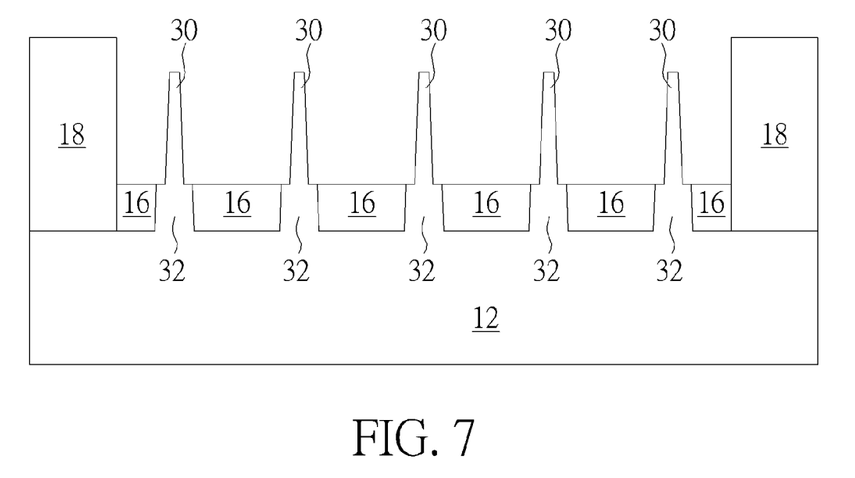
FIGS. 7-9 illustrate a method for fabricating semiconductor device according to an embodiment of the present invention.
Figure 8:
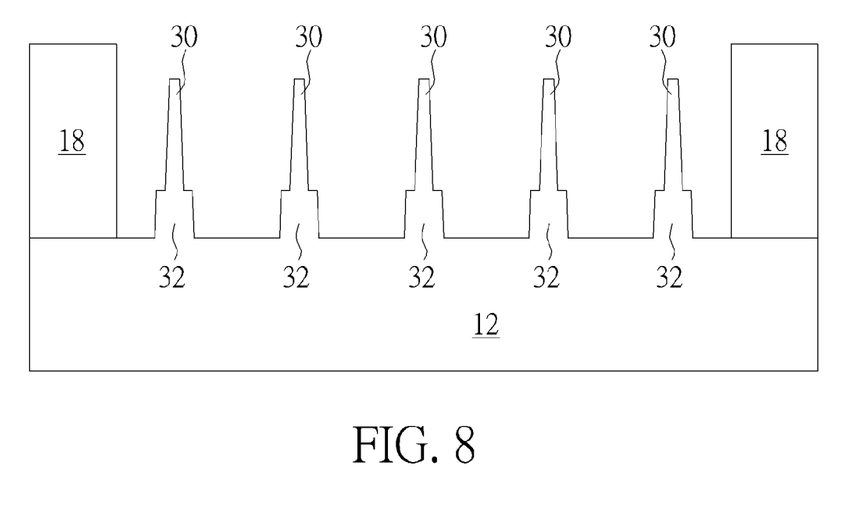
Figure 9:
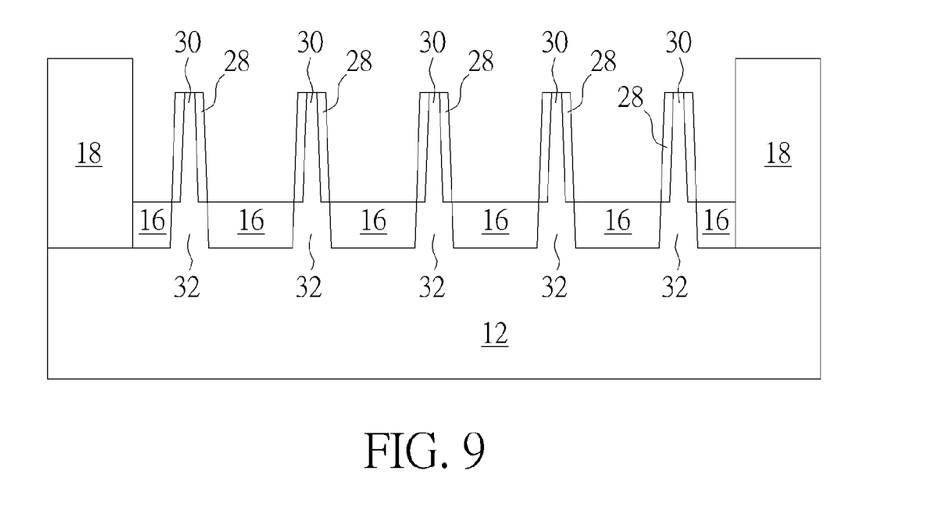

Referring to FIGS. 7-9, FIGS. 7-9 illustrate a method for fabricating semiconductor device according to an embodiment of the present invention. As shown in FIG. 7, the structure from FIG. 4 is first provided, and an isotropic etching process is conducted to remove part of the fin-shaped structures 14 so that the fin-shaped structures 14 above the horizontal plane of the top surface of first STI 16 is shrunk or reduced in size overall. This divides each of the fin-shaped structures 14 into a top portion 30 and a bottom portion 32, in which the bottom surface of the top portion 30 is less than the top surface of the bottom portion 32.

Next, as shown in FIG. 8, an etching process is conducted by using a patterned mask to remove all of the first STI 16 between fin-shaped structures 14 and expose part of the substrate 12 surface, and an epitaxial layer (not shown) is formed on the fin-shaped structures 14 thereafter.

As shown in FIG. 9, an epitaxial growth process could be conducted after the structure from FIG. 7 is completed to form an epitaxial layer 28 on the sidewalls of the top portion 30 of each fin-shaped structure 14. Since a width difference is present between the top portion 30 and bottom portion 32, the epitaxial layer 28 could be formed to align to the sidewall of the bottom portion 32 or not align to the sidewalls of the bottom portion 32.

Figure 10:
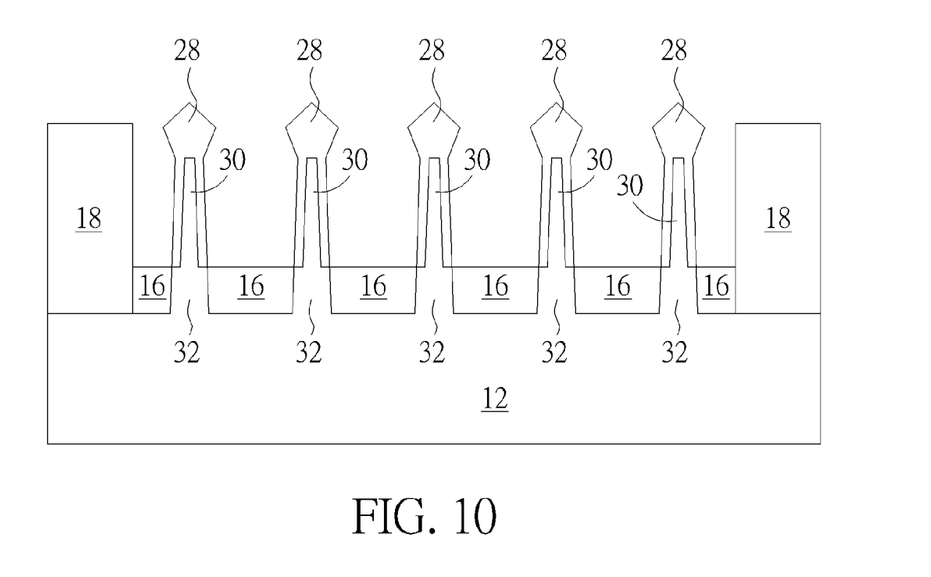
FIGS. 10-11 illustrate structural views of a semiconductor device according to different embodiments of the present invention.

Referring to FIG. 10, FIG. 10 illustrates a structural variation of FIG. 9 according to an embodiment of the present invention. As shown in FIG. 10, it would be desirable to adjust the covering area of the epitaxial layer 28 by having the epitaxial layer 28 not only disposed on the sidewalls of the top portion 30 but also on the top surface of the top portion 30, and the top surface of the epitaxial layer 28 disposed on top of the top portion 30 could be higher or lower than the top surface of the adjacent second STI 18, which are all within the scope of the present invention.

Figure 11:
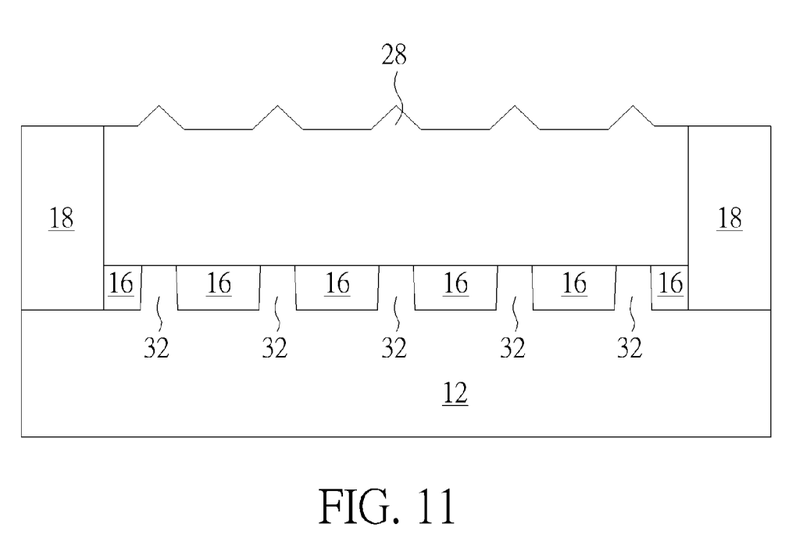

Referring to FIG. 11, FIG. 11 illustrates a structural variation of FIG. 9 according to an embodiment of the present invention. As shown in FIG. 11, it would be desirable to merge the epitaxial layer 28 with all of the top portions 30 for forming into a single epitaxial layer 20, and the top surface of the epitaxial layer 28 could be higher than the top surface of the surrounding second STI 18 as shown in FIG. 11 or could also be lower than the top surface of the second STI 18. Preferably, the bottom surface of the single epitaxial layer 28 is even with the top surfaces of the first STI 16 and bottom portions 32 of the fin-shaped structures 14.

Figure 12:
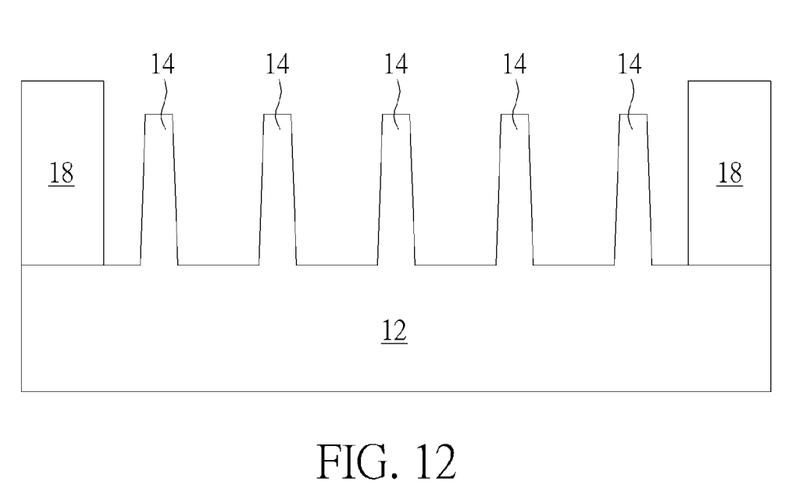
FIGS. 12-13 illustrate a method for fabricating semiconductor device according to an embodiment of the present invention.
Figure 13:
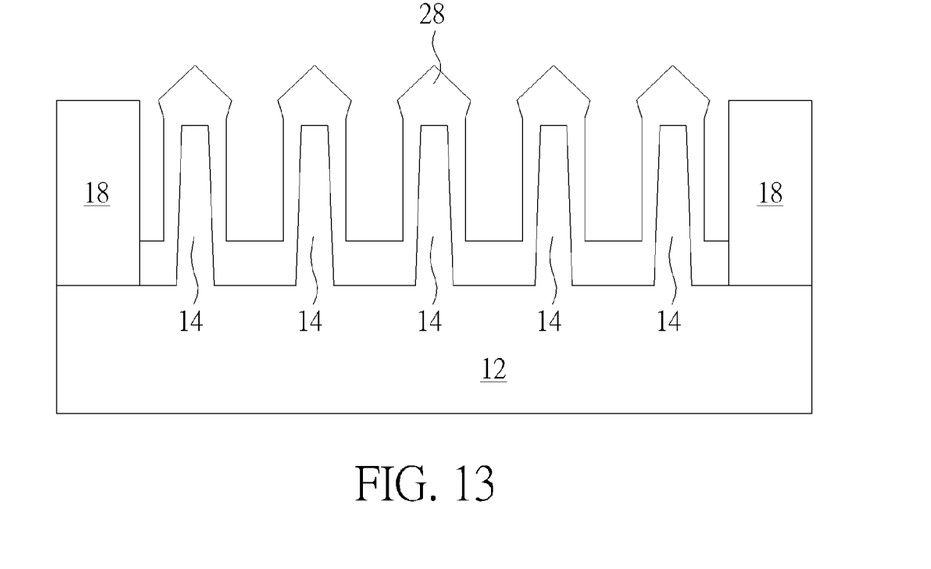

Referring to FIGS. 12-13, FIGS. 12-13 illustrate a method for fabricating semiconductor device according to an embodiment of the present invention. As shown in FIG. 12, the structure from FIG. 4 is first provided, a patterned mask (not shown) such as a patterned resist is formed to cover the fin-shaped structures 14 and regions outside the first STI 16, and an etching process is conducted by using the patterned resist as mask to remove the first STI 16 completely and even part of the STI 18 and expose the substrate 12 between fin-shaped structures 14.

Next, as shown in FIG. 13, an epitaxial growth process is conducted to form an epitaxial layer 28 on the fin-shaped structures 14 and the substrate 12. Specifically, since no first STI 16 is remained between the fin-shaped structures 14, the epitaxial layer 28 is preferably grown on the top surface and sidewalls of the fin-shaped structures 14 and on the substrate 12 between fin-shaped structures 14. Preferably, the epitaxial layer 28 is formed to contact the substrate 12 surface but not filling the space between fin-shaped structures 14. The epitaxial layer 28 could also be formed to extend to the top surface and sidewalls of the second STI 18, which is also within the scope of the present invention.

Figure 14:
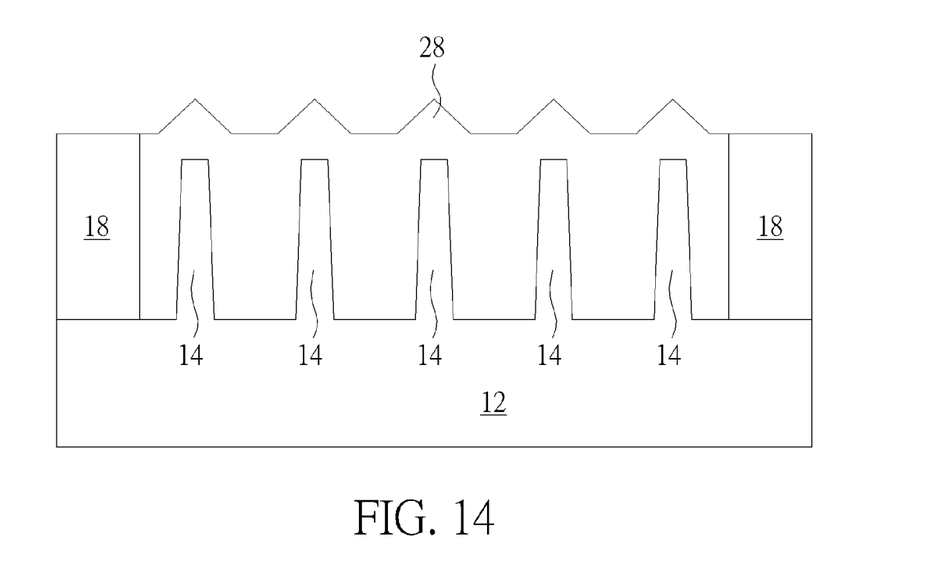
FIG. 14 illustrates a structural view of a semiconductor device according to an embodiment of the present invention.

Similar to the embodiment disclosed in FIG. 6, as shown in FIG. 14, it would also be desirable to adjust the covering area of the epitaxial layer 28 by having the epitaxial layer 28 fill all of the space between fin-shaped structures 14 and above the substrate 12, which is also within the scope of the present invention.

According to an embodiment of the present invention, it would be desirable to conduct an anneal process after the structures disclosed in FIG. 5, FIG. 6, FIG. 9, FIG. 10, FIG. 13, and FIG. 14 are completed to drive germanium atoms from the epitaxial layer 28 into the fin-shaped structures 14. Next, an oxide layer formed around each of the fin-shaped structures 14 as a result of the anneal process is removed to form fin-shaped structures 14 composed of germanium atoms. According to yet another embodiment of the present invention, the material of the epitaxial layer disclosed in the aforementioned embodiments could all be adjusted according to the demand of the product. For instance, the material of the epitaxial layer could be the same as the material of the fin-shaped structures, the epitaxial layer could include n-type or p-type dopants or could include multi-layered structures, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a plurality of fin-shaped structures thereon;
   forming a first shallow trench isolation (STI) between the fin-shaped structures and a second STI around the fin-shaped structures;
   removing part of the fin-shaped structures;
   removing part of the first STI so that the top surfaces of the fin-shaped structures are higher than the top surface of the first STI and lower than the top surface of the second STI; and
   forming an epitaxial layer adjacent to the sidewalls of the fin-shaped structures after removing part of the fin-shaped structures, wherein a top surface of the epitaxial layer is higher than a top surface of the second STI.

2. The method of claim 1, further comprising forming an epitaxial layer on the first STI, the second STI, the fin-shaped structures, and sidewalls of the fin-shaped structures.

3. The method of claim 1, further comprising forming an epitaxial layer on the first STI, the second STI, and the fin-shaped structures while filling the space between the fin-shaped structures.

4. The method of claim 1, further comprising:
   removing the first STI completely after removing part of the fin-shaped structures; and
   forming an epitaxial layer on the substrate, the second STI, the fin-shaped structures, and sidewalls of the fin-shaped structures.

5. The method of claim 1, further comprising:
   removing the first STI completely after removing part of the fin-shaped structures; and
   forming an epitaxial layer on the substrate, the second STI, and the fin-shaped structures while filling the space between the fin-shaped structures.

6. The method of claim 1, further comprising:
   removing part of the fin-shaped structures after removing part of the first STI to divide each of the fin-shaped structures into a top portion and a bottom portion, wherein the bottom surface of the top portion is less than the top surface of the bottom portion.

7. The method of claim 6, further comprising removing the first STI completely after removing part of the fin-shaped structures.

8. The method of claim 1, wherein the bottom surface of the first STI is even with the bottom surface of the second STI.

9. A semiconductor device, comprising:
   a substrate;

a plurality of fin-shaped structures on the substrate, wherein each of the fin-shaped structures comprises a top portion and a bottom portion and a top surface and a bottom surface of the top portion are narrower than a top surface of the bottom portion;

a first shallow trench isolation (STI) between the fin-shaped structures and a second STI around the fin-shaped structures, wherein the top surfaces of the fin-shaped structures are higher than the top surface of the first STI and lower than the top surface of the second STI; and an epitaxial layer on the sidewalls of the fin-shaped structures, wherein a top surface of the epitaxial layer is higher than a top surface of the second STI.

10. The semiconductor device of claim 9, further comprising:

an epitaxial layer on the first STI, the second STI, the fin-shaped structures, and sidewalls of the fin-shaped structures.

11. The semiconductor device of claim 9, further comprising:

an epitaxial layer on the first STI, the second STI, and the fin-shaped structures while filling the space between the fin-shaped structures.

12. The semiconductor device of claim 9, wherein the bottom surface of the first STI is even with the bottom surface of the second STI.

13. The semiconductor device of claim 9, further comprising the epitaxial layer on the sidewalls and top surface of the top portion.

14. A semiconductor device, comprising:

a substrate;

a plurality of fin-shaped structures on the substrate;

a STI around the fin-shaped structures, wherein the top surfaces of the fin-shaped structure are lower than the top surface of the STI; and an epitaxial layer on the top surfaces and sidewalls of the fin-shaped structures and contacting the substrate, wherein a top surface of the epitaxial layer is higher than a top surface of the STI.

15. The semiconductor device of claim 14, wherein the epitaxial layer fills the space between the fin-shaped structures.

16. The semiconductor device of claim 14, wherein the top surface of the epitaxial layer is higher than the top surface of the STI.

* * * * *